United States Patent [19]

Iida et al.

[11] 4,358,354

[45] Nov. 9, 1982

[54] URETHANE PHOTOSENSITIVE RESINOUS COMPOSITION

[75] Inventors: Kiichi Iida; Tadashi Kawamoto; Kazuhito Miyoshi, all of Fuji, Japan

[73] Assignee: Asahi Kasei Kogyo Kabushiki Kaisha, Osaka, Japan

[21] Appl. No.: 236,954

[22] Filed: Feb. 23, 1981

[30] Foreign Application Priority Data

Feb. 28, 1980 [JP] Japan ................... 55-24337

[51] Int. Cl.$^3$ ............................... C08F 8/00
[52] U.S. Cl. ..................... 204/159.15; 204/159.14; 204/159.19
[58] Field of Search ............... 204/159.14, 159.15, 204/159.19

[56] References Cited

U.S. PATENT DOCUMENTS

| | | | |
|---|---|---|---|
| 3,891,523 | 6/1975 | Hisamatsu et al. | 204/159.19 |
| 3,960,572 | 6/1976 | Ibata et al. | 204/159.14 |
| 4,162,274 | 7/1979 | Rosenkranz | 204/159.19 |
| 4,216,267 | 8/1980 | Lorenz et al. | 204/159.19 |
| 4,239,866 | 12/1980 | Reitel et al. | 204/159.19 |
| 4,250,248 | 2/1981 | Faust | 204/159.19 |
| 4,255,243 | 3/1981 | Coqueugnoit et al. | 204/159.19 |

*Primary Examiner*—Melvyn I. Marquis

*Attorney, Agent, or Firm*—Sprung, Horn, Kramer & Woods

[57] ABSTRACT

A urethane photosensitive resinous composition composition comprising (a) at least one urethane prepolymer having in the middle of the molecule thereof at least two polyol compound monomer units linked through a diisocyanate compound monomer unit, and having only in the terminals of the molecule thereof at least 1.6 carboxyl groups on the average per molecule and acrylic residues with a vinyl group, each one of said acrylic residues being substantially present in each terminal of the molecule of said at least one urethane prepolymer, (b) at least one ethylenically unsaturated compound, and (c) at least one photopolymerization initiator. If desired, the urethane photosensitive resinous composition may further comprise at least one heat polymerization inhibitor. The photosensitive resinous composition of the present invention, in the process of producing printing plates, is good in developability with aqueous developers and capable of becoming sufficient in mechanical strength upon post exposure to even a small amount of light even in the presence of air, and can provide letterpress printing plates that are substantially free of surface tack and have high resistances to water or moisture and to abrasion and wear and, hence, long printing durability.

18 Claims, No Drawings

URETHANE PHOTOSENSITIVE RESINOUS COMPOSITION

This invention relates to a photosensitive resinous composition. More particularly, the present invention relates to a urethane photosensitive resinous composition which may advantageously be used especially for the production of letterpress printing plates.

Various photosensitive resinous compositions usable for the production of printing plates have been developed, and resin printing plates prepared from such photosensitive resinous compositions have been increasingly used in the field of printing. The above-mentioned photosensitive resinous compositions can be roughly classified into those of liquid type and those of solid type according to the states of the compositions prior to exposure thereof to light. Both types of the photosensitive resinous compositions have respective merits and demerits. The photosensitive resinous compositions of liquid type have such merits that they can generally be manufactured at low cost, that most of them are capable of being developed with developers of aqueous liquid type, that they can provide printing plates having varied thicknesses as desired, and that they are able to be easily recovered from unexposed portions thereof after exposure to light and reused if desired. Thus, they provide the makers of printing plates with various advantages such as the betterment of workng environments and the reduction of production costs of printing plates. However, printing plates prepared from the photosensitive resinous compositions of liquid type are often poorer in respect of printing durability or copy tolerance (capability of withstanding printing) than conventional metal or rubber printing plates, and often slightly poorer in the same respect than even printing plates prepared from the photosensitive resinous compositions of solid type although the printing durability of printing plates depends on conditions of printing and manner of handling the printing plates. With a view to improving such poor printing durability as the photosensitive resinous compositions of liquid type inherently have, photosensitive resinous compositions have been developed which are characterized by comprising an unsaturated urethane prepolymer. Such photosensitive resinous compositions comprising an unsaturated urethane prepolymer, an example of which is disclosed in U.S. Pat. No. 3,960,572, are greatly improved in resistances to water or moisture and to abrasion and wear, and, hence, essentially excellent in printing durability or copy tolerance.

However, these urethane photosensitive resinous compositions are unsatisfactory in developability with aqueous developers, and printing plates prepared therefrom, after development, have to be subjected to post-exposure to light in an inert medium such as water or nitrogen, which is free of air and capable of transmitting actinic radiation, because otherwise the printing plates are so tacky in both the relief areas and the non-relief areas as to cause troubles such as picking or peeling of paper skin and adhesion of paper dust to the printing plates during the course of printing under some printing conditions and as to give a bad feeling to printing plate handlers. Therefore, the urethane photosensitive resinous compositions are inferior in simplification of the process of producing printing plates to unsaturated polyester type photosensitive resinous compositions which need not such post-exposure to light. Accordingly, there has been a serious demand in this respect for improvement of the urethane photosensitive resinous compositions.

As one of the urethane photosensitive resinous compositions comprising an unsaturated urethane prepolymer, there is disclosed in U.S. Pat. No. 3,960,572 a photosensitive resinous composition which comprises an unsaturated urethane prepolymer having carboxyl group-containing residues of itaconic acid introduced thereinto at the terminals of the molecule thereof. However, such a urethane photosensitive resinous composition has low radical self-polymerizability and low copolymerizability with an acrylate or a methacrylate used as a crosslinking agent owing to the low reactivity of carbon-carbon double bonds derived as the polymerizable ethylenic unsaturation of the urethane prepolymer from itaconic acid, with the results that no sufficient mechanical strength evaluated in terms of tensile strength and so on is attained in a photopolymer formed from the photosensitive resinous composition unless a large amount of light is used in post-exposure, and that a printing plate made of such a photopolymer is difficult owing to the above-mentioned low radical self-polymerizability or low copolymerizability to rid of surface tack in not only the relief areas but also the non-relief areas by post-exposure to light in spite of the presence in the urethane prepolymer of carboxyl groups which may generally have a tack-eliminating effect since they may enable the unexposed portions of the composition to be sufficiently washed away in development.

On the other hand, there is disclosed in U.S. Pat. No. 4,162,274 a crosslinkable urethane resin which is a product produced by the steps of reacting (1) a polyepoxide compound having more than one 1,2-epoxide group with acrylic acid and/or methacrylic acid until 60 to 100 mol% of the 1,2-epoxide groups are converted into $\beta$-hydroxy acrylic and/or methacrylic acid ester groups, (2) reacting 30 to 90 mol% of the hydroxyl groups of said $\beta$-hydroxy ester groups with an isocyanate, and (3) reacting 10 to 70 mol% of the hydroxyl groups of said $\beta$-hydroxy ester groups with a cyclic dicarboxylic anhydride, and which is suitable as starting materials for the production of dry resist films having improved adhesion of the photopolymer to a substrate such as a copper plate and for the production of photopolymer printing plates or matrices having improved resistance to heat which is desired especially for matrices. When the urethane resin of said U.S. patent is prepared by using a monoisocyanate, a photosensitive resinous composition containing the urethane resin of said U.S. patent is not only insufficient in developability with aqueous developers but also, upon post-light-exposure in air, cannot be sufficiently rid of surface tack particularly in the relief-unexposed areas (the areas where the composition is not subjected to relief exposure for forming a relief image but to back exposure for forming an anchor layer) because the urethane resin has in the molecule thereof less than one carboxyl group on the average in the typical case of use of a diepoxide compound. When a diisocyanate is used, the urethane resin of said U.S. patent has acrylic double bonds in the side chains, formed through urethane groups, of the molecule thereof in addition to acrylic double bonds present in the terminals of the backbone chain of the molecule thereof, and has in the molecule thereof less than 1.4 carboxyl groups on the average in the typical case of use of a diepoxide compound. Therefore, a photopolymer formed from a photosensitive resinous composition containing said urethane resin is so hard owing to too high a density of acrylic double bonds contained in said urethane resin that it cannot be used as printing plates for the printing of business forms and books which requires rubber elasticity for printing plates, and the photosensitive resinous composition still is not only insufficient in developability with aqueous developers but also, even upon post-light-exposure in air, cannot be so sufficiently rid of surface tack in both the relief areas and non-relief areas as to present no problem from the practical point of view. Thus, said U.S. patent does not provide a solution to the problems of demerits inherently accompanying the conventional urethane photosensitive resinous compositions.

It is an object of the present invention to provide a urethane photosensitive resinous composition free of the demerits of the conventional photosensitive resinous compositions which composition, in the process of producing printing plates, is good in developability with aqueous developers and capable of becoming sufficient in mechanical strength upon post-exposure to even a small amount of light even in the presence of air, and which composition can provide printing plates that are substantially free of surface tack and have high resistances to water or moisture and to abrasion and wear and, hence, long printing durability.

We have made intensive investigations with a view to attaining the above-mentioned object to complete the present invention which provides a novel urethane photosensitive resinous composition characterized by comprising a specific urethane prepolymer.

More specifically, in accordance with the present invention, there is provided a urethane photosensitive resinous composition comprising (a) at least one urethane prepolymer having in the middle of the molecule thereof at least two polyol compound monomer units linked through a diisocyanate compound monomer unit, and having only in the terminals of the molecule thereof at least 1.6 carboxyl groups on the average per molecule and acrylic residues represented by the formula:

Wherein R is a hydrogen atom or a methyl group, each one of said acrylic residues being substantially present in each terminal of the molecule of said at least one urethane prepolymer, (b) at least one ethylenically unsaturated compound, and (c) at least one photopolymerization initiator. If desired, the urethane photosensitive resinous composition of the present invention may further comprise at least one heat polymerization inhibitor.

At least one urethane prepolymer (a) to be used in the photosensitive resinous composition of the present invention may typically be selected from the group consisting of (i) urethane prepolymers which are obtained by reacting an isocyanate-terminated urethane prepolymer with at least one acrylic compound having two hydroxyl groups at an [NCO]/[OH] ratio of up to ½ and reacting the resultant with at least one dicarboxylic anhydride ([NCO] represents the number of NCO groups and [OH] represents the number of OH groups, such brackets appearing hereinafter have the similar meanings), (ii) urethane prepolymers which are obtained by reacting an isocyanate-terminated urethane prepolymer with at least one acrylic compound having one hydroxyl group and one carboxyl group at an [NCO]/[OH] ratio of up to 1/1, (iii) urethane prepolymers which are obtained by reacting an isocyanate-terminated urethane prepolymer with at least one oxirane compound having one hydroxyl group at an [NCO]/[OH] ratio of up to 1/1, reacting the resultant with at least one acrylic compound having one carboxyl group at an [oxirane ring]/[COOH] ratio of up to 1/1 and further reacting the resultant with at least one dicarboxylic anhydride, (iv) urethane prepolymers which are obtained by reacting a hydroxyl-terminated urethane prepolymer with at least one oxirane compound having one halogen atom at an [OH]/[halogen atom] ratio of up to 1/1, reacting the resultant with acrylic acid and/or methacrylic acid and further reacting the resultant with at least one dicarboxylic anhydride, and (v) urethane prepolymers which are obtained by reacting a hydroxyl-terminated urethane prepolymer with at least one anhydride of a polycarboxylic acid having at least three carboxyl groups including only two carboxyl groups forming an anhydride ring at an [OH]/[anhydride ring] ratio of up to 1/1 and reacting the resultant with at least one acrylic compound having one oxirane ring to introduce substantially one residue of said at least one acrylic compound in each terminal of the resulting urethane prepolymer.

The urethane photosensitive resinous composition of the present invention is characterized due to the use of a specific urethane prepolymer (a) in (1) that it, upon exposure to light, can form a photopolymer having high resistances to water or moisture and to abrasion and wear which are attributable to a chemical structure of a polyurethane constituting the basic polymer of the photopolymer, (2) that it is so improved in radical polymerizability due to the ethylenic double bonds of acrylic type each introduced substantially in each terminal of the urethane prepolymer molecule as to form upon exposure to even a small amount of light a photopolymer having high mechanical strength and desired rigidity or rubber elasticity that can be easily designed, (3) that it is improved in developability with aqueous developers due to as relatively large a number as close upon two to more than two, per molecule, of the carboxyl groups introduced in the terminals of the urethane prepolymer molecule, and (4) that because of the synergistic effect of (2) and (3) above it can provide a photopolymer printing plate which has markedly decreased surface tack in both the image areas and the non-image areas and can be rid of the residual surface tack by post-light-exposure even in air.

The isocyanate-terminated urethane prepolymer used in the preparation of the urethane prepolymers mentioned before under (i), (ii) and (iii) may be prepared, for example, by reacting a polyol compound preferably having two hydroxyl groups with an excess diisocyanate compound. The hydroxyl-terminated urethane prepolymer used in the preparation of the urethane prepolymers mentioned before under (iv) and (v) may be prepared, for example, by reacting a diisocyanate compound with an excess polyol compound preferably having two hydroxyl groups.

As the polyol compound used in the preparation of the isocyanate-terminated or hydroxyl-terminated urethane prepolymer, there can be mentioned, for example, alkanepolyols, polyether polyols and polyester polyols commonly used in the production of conventional polyurethanes. The weight average molecular weight of the polyol compound may be chosen depending upon the desired hardness of a photopolymer formed from the urethane photosensitive resinous composition of the present invention, but is preferably up to 5,000. When the photopolymer is desired to have high hardness, the preferred weight average molecular weight of the polyol compound is in the range of from 62 to 500. When the photopolymer is desired to have low hardness, the preferred weight average molecular weight of the polyol compound is in the range of from 2,000 to 5,000. Examples of alkanepolyols having at least two hydroxyl groups and a relatively low molecular weight include those having a straight or branched carbon chain consisting of up to 20 carbon atoms, such as ethylene glycol, propylene glycol, glycerin, propanediols, butanediols, neopentyl glycol, 1,6-hexanediol and 1,3-butylene glycol. Examples of polyether polyols having at least two hydroxyl groups include polyethylene glycol, polypropylene glycol, poly-1,4-oxybutylene glycol, polyepichlorohydrin and random or block copolymers of ethylene oxide and propylene oxide. Examples of polyester polyols having at least two hydroxyl groups include polylactones such as those obtained by the ring-opening polymerization of a lactone with an initiator such as ethylene glycol or polyethylene glycol, e.g., polycaprolactones derived from $\epsilon$-caprolactone or the like and polyvalerolactones derived from $\gamma$- or $\delta$-valerolactone; and polycondensates obtained by the polycondensation of an aliphatic alcohol having at least two hydroxyl groups with an aliphatic carboxylic acid having at least two carboxyl groups, e.g., polyethylene adipate, polypropylene adipate, polybutylene adipate, polyethylene succinate, polyhexamethylene adipate, and analogues of such polycondensates obtained by replacing part of the saturated aliphatic carboxylic acid used in the preparation of each of such polycondensates with at least one unsaturated aliphatic carboxylic acid or its anhydride such as fumaric acid, maleic acid or maleic anhydride and/or at least one aromatic carboxylic acid or its anhydride such as isophthalic acid, terephthalic acid, phthalic acid or phthalic anhydride in such an amount as not to spoil the physical properties and the like of each of such polycondensates. The above-mentioned polyols may be used either alone or in mixture.

Various known diisocyanates compounds may be used either alone or in mixture in the preparation of the isocyanate-terminated or hydroxyl-terminated urethane prepolymer. The use of a mixture of at least two kinds of diisocyanate compounds may serve in some cases for providing desired physical properties for the photosensitive resinous composition of the present invention and for a photopolymer formed therefrom. Examples of diisocyanate compounds include 2,4-tolylene diisocyanate, 2,6-tolylene diisocyanate, hydrogenated 2,4-tolylene diisocyanate, hydrogenated 2,6-tolylene diisocyanate, m-phenylene diisocyanate, p-phenylene diisocyanate, 1,3-dimethylphenyl-2,4-diisocyanate, 1,3-dimethylphenyl-4,6-diisocyanate, 1,4-dimethylphenyl-2,5-diisocyanate, 1-chlorophenyl-2,4-diisocyanate, 4,4'-diphenyl diisocyanate, 3,3'-dimethyl-4,4'-diphenyl diisocyanate, 2,4'-diphenyl diisocyanate, 3,3'-dimethoxy-4,4'-diphenylmethane diisocyanate, 3,3'-dimethyl-4,4'-diphenylmethane diisocyanate, 4,4'-diphenylmethane diisocyanate, 1,4-naphthalene diisocyanate, 1,5-naphthalene diisocyanate, 2,6-naphthalene diisocyanate, 2,7-naphthalene diisocyanate, p-xylylene diisocyanate, m-xylylene diisocyanate, 1,4-tetramethylene diisocyanate, 1,5-pentamethylene diisocyanate, 1,6-hexamethylene diisocyanate, 1,7-heptamethylene diisocyanate, 1,8-octamethylene diisocyanate, 1,9-nonamethylene diisocyanate, 1,10-decamethylene diisocyanate, 2,2,4-trimethyl-1,5-pentamethylene diisocyanate, 2,2'-dimethyl-1,5-pentamethylene diisocyanate, 3-methoxy-1,6-hexamethylene diisocyanate, 3-butoxy-1,6-hexamethylene diisocyanate, $\omega,\omega'$-dipropyl-ether diisocyanate, 1,4-cyclohexyl diisocyanate, 1,3-cyclohexyl diisocyanate, and isophorone diisocyanate.

The urethane-forming reaction between a polyol compound and a diisocyanate compound may be carried out according to any of known methods practiced in the field of urethane manufacturing. For example, the reaction may be carried out at a temperature ranging from 40° C. to 100° C. for 50 minutes to 6 hours. According to need, a catalyst such as a tertiary amine or a tin compound may be used in the urethane-forming reaction. As is well known, when the reaction is carried out at an [NCO]/[OH] ratio of more than 1/1, an isocyanate-terminated urethane prepolymer is predominantly obtained, while a hydroxyl-terminated urethane prepolymer can be predominantly obtained by carrying out the reaction at an [NCO]/[OH] ratio of less than 1/1. A choice between the isocyanate-terminated urethane prepolymer and the hydroxyl-terminated urethane prepolymer depends on which urethane prepolymer of those mentioned before under (i) to (v) is desired to be used in the photosensitive resinous composition of the present invention. It is necessary from the viewpoint of resistance to abrasion and wear of a photopolymer formed from the photosensitive resinous composition of the present invention that the urethane-forming reaction be so carried out that the resulting isocyanate-terminated or hydroxyl-terminated urethane prepolymer has in its molecule at least two polyol compound monomer units linked or chain-extended through the diisocyanate compound monomer unit.

The introduction of ethylenic double bonds of acrylic type and carboxyl groups into the terminals of the molecule of the isocyanate-terminated or hydroxyl-terminated urethane prepolymer can be carried out as follows.

Preparation of urethane prepolymers (i)

The first step reaction of an isocyanate-terminated urethane prepolymer with an acrylic compound having two hydroxyl groups is conducted at a ratio defined by the formula: [NCO]/[OH]≦½. If the ratio is larger than ½, the introduction of ethylenic double bonds substantially into both the terminals of the molecule of the isocyanate-terminated urethane prepolymer and the introduction of carboxyl groups into the molecule of the resultant in the subsequent second step reaction are both insufficient, and a photopolymer formed from a photosensitive resinous composition comprising the resulting urethane prepolymer has many lattice defects in the molecular network thereof on account of insufficient introduction of ethylenic double bonds and, hence, is liable to be poor is mechanical strength. The first step reaction may be carried out in the absence or presence of a catalyst such as a tertiary amine or a tin compound, for example, at a temperature of 40° to 100° C. for 90 minutes to 4 hours. Any acrylic compounds having two hydroxyl groups can be used in this first step reaction, but acrylic compounds having primary and/or secondary hydroxyl groups are preferred because the primary and/or secondary hydroxyl groups are good in reactivities with both of an isocyanate group and an acid anhydride and, hence, enable the reactions involved in the preparation of the desired urethane prepolymer to be completed in a short time.

As the preferred acrylic compounds, there can be mentioned those represented by the general formula:

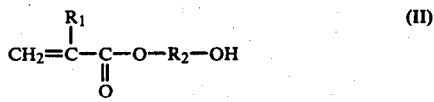

wherein $R_1$ is a hydrogen atom or a methyl group, and $R_2$ is

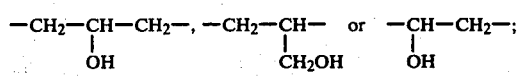

and those represented by the general formula:

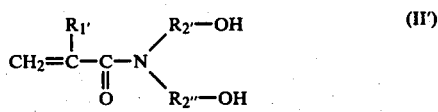

wherein $R_{1'}$ is a hydrogen atom or a methyl group, and $R_{2'}$ and $R_{2''}$ each independently is a straight or branched chain alkylene group having 1 to 12 carbon atoms.

They may be used either alone or in mixture. Specific examples of acrylic compounds of the formula (II') include N,N-hydroxymethylacrylamide, N,N-hydroxymethylmethacrylamide, N,N-di(4-hydroxybutyl)acrylamide, N,N-di(4-hydroxybutyl)methacrylamide, N-(2-hydroxyethyl)-N-hydroxypropyl)acrylamide and N-(2-hydroxyethyl)-N-(hydroxypropyl)methacrylamide.

The second step reaction is effected between the residual hydroxyl group contained in the residue of the acrylic compound present in the terminals of the molecule of the product obtained by the first step reaction and the acid anhydride ring of a dicarboxylic anhydride to introduce carboxyl groups into the terminals of the molecule of the first step reaction product. It is well known that the introduction of a carboxyl group can also be effected by the half ester-forming reaction between a hydroxyl group and one carboxyl group of a dicarboxylic acid, which reaction, however, disadvantageously is slow in advance as compared with the reaction between a hydroxyl group and the acid anhydride ring of a dicarboxylic anhydride and needs the removal from the reaction system of water being formed during the course of the reaction. The use of a dicarboxylic anhydride in the second step reaction has a significant meaning since the reaction between a hydroxyl group and the acid anhydride ring of the dicarboxylic anhydride proceeds selectively to introduce carboxyl groups in the terminals of the molecule of the first step reaction product with avoidance or minimization of an unfavorable increase in molecular weight of the desired urethane prepolymer (i) being formed as will be apparent from the above-mentioned fact that the acid anhydride ring of a dicarboxylic anhydride is higher in esterification reactivity with a hydroxyl group than a carboxyl group. The second step reaction may be carried out in the absence or presence of an esterification catalyst preferably at a temperature of 60° to 100° C. for 90 minutes to 8 hours. It is noted that even after several hours' continuation of the second step reaction in the absence of an esterification catalyst at a temperature of 100° C. or less, the viscosity of the resulting urethane prepolymer does not substantially change from that of the first step reaction product.

As the preferred dicarboxylic anhydrides used in the second step reaction, there can be mentioned those respectively represented by the general formulae:

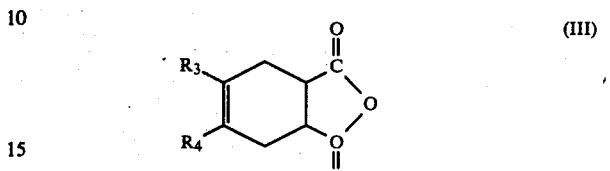

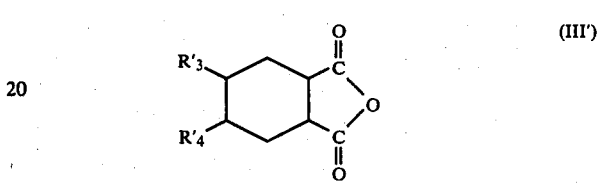

and

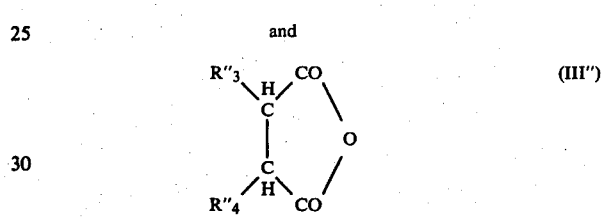

wherein $R_3$, $R_4$, $R_{3'}$, $R_{4'}$, $R_{3''}$ and $R_{4''}$ each independently is a hydrogen atom or a lower alkyl group having 1 to 3 carbon atoms,
1,3-propanedicarboxlic anhydride, 1,4-butanedicarboxylic anhydride, and 1,5-pentanedicarboxylic anhydride. They may be used either alone or in mixture. Those dicarboxylic anhydrides of the formula (III), (III') or (III'') wherein $R_3$, $R_4$, $R_{3'}$, $R_{4'}$, $R_{3''}$ and $R_{4''}$ each independently is a hydrogen atom or a methyl group are more preferred from the viewpoint of availability. Most preferred is succinic anhydride.

It is noted that if desired, the first and second step reactions can be simultaneously carried out by simultaneously adding an acrylic compound with two hydroxyl groups and a dicarboxylic anhydride to an isocyanate-terminated urethane prepolymer.

Preparation of urethane prepolymer (ii)

The reaction of an isocyanate-terminated urethane prepolymer with an acrylic compound having one hydroxyl group and one carboxyl group is conducted at a ratio defined by the formula: [NCO]/[OH]≦1/1. This reaction is advantageous in that it can form the desired urethane prepolymer from the isocyanate-terminated urethane prepolymer as a starting material only in one step. Although the acrylic compound having two kinds of active hydrogen atoms is used in the reaction, it is possible to effect the urethane-forming reaction between the hydroxyl group and the isocyanate group without a marked increase in viscosity of the desired urethane prepolymer being formed if reaction conditions are mild because the reaction between the carboxyl group and the isocyanate group is far slow, by the order of several figures ot times in terms of a rate of reaction, in advance as compared with the reaction between the hydroxyl group and the isocyanate group. The reaction may advantageously be carried out under mild conditions, i.e. in the substantial absence of a catalyst at a temperature of 50° to 80° C. for 50 minutes to 6 hours. Especially when a catalyst is used in the preparation of the isocyanate-terminated urethane prepolymer, no catalyst is desired to be additionally used in this reaction.

As the preferred acrylic compounds used in the reaction, there can be mentioned those represented by the general formula:

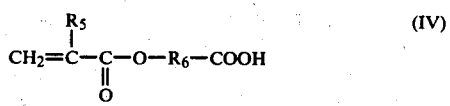
(IV)

wherein $R_5$ *is a hydrogen atom or a methyl group, and $R_6$* is a divalent group of the formula:

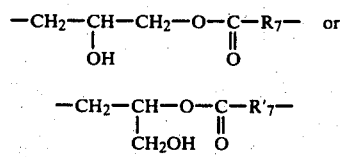

wherein $R_7$ and $R_7'$ each is a divalent group of the formula:

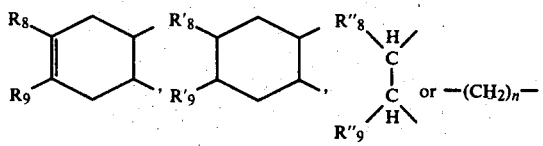

wherein $R_8$, $R_9$, $R_8'$, $R_9'$, $R_8''$ and $R_9''$ each independently is a hydrogen atom or a lower alkyl group having 1 to 3 carbon atoms, and n is an integer of 3 to 5.

They may be used either alone or in mixture.

Preparation of urethane prepolymers (iii)

Three steps of reactions are involved in the preparation of urethane prepolymers (iii).

The first step reaction of an isocyanate-terminated urethane prepolymer with an oxirane compound having one hydroxyl group is conducted at a ratio defined by the formula: [NCO]/[OH]≦1/1 under conditions commonly employed in the usual urethane-forming reaction as described before as being carried out between a polyol compound and a diisocyanate compound.

As the preferred oxirane compounds used in the first step reaction, there can be mentioned those represented by the general formula:

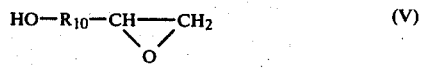
(V)

wherein $R_{10}$ is a straight or branched clain alkylene group having 1 to 10 carbon atoms or a divalent group of the formula:

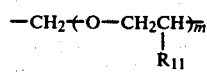

wherein $R_{11}$ is a hydrogen atom or a methyl group, and m is an integer of 1 to 3.

They may be used either alone or in mixture.

The second step reaction of the first step reaction product, which is an epoxy-terminated urethane prepolymer, with an arcylic compound having one carboxyl group is conducted at a ratio defined by the formula: [oxirane ring]/[COOH]≦1/1 to effect a ring-opening addition reaction between the carboxyl group and the epoxy group. The reaction may be carried out in the presence of an amine catalyst for facilitating the ring opening of an epoxy group, such as trimethylbenzylammonium hydroxide or benzylmethylamine, for example, at a temperature of 80° to 150° C. for 90 minutes to 6 hours. Acrylic acid and methacrylic acid are most preferably used either alone or in mixture as the acrylic compound having one carboxyl group because of good availability.

The third step reaction is effected between an hydroxyl group formed by the second step ring-opening addition reaction and contained in the second step reaction product and the acid anhydride ring of a dicarboxylic anhydride to yield the desired urethane prepolymer. The reaction may be carried out in substantially the same manner as in the second step reaction involved in the preparation of urethane prepolymers (i) described before. Dicarboxylic anhydrides that may be used in the preparation of urethane prepolymers (i) may also be used in this third step reaction.

Preparation of urethane prepolymers (iv)

The first step reaction of a hydroxyl-terminated urethane prepolymer with an oxirane compound having one halogen atom is conducted at a ratio defined by the formula: [OH]/[halogen atom]≦1/1. The addition of the oxirane compound to the hydroxyl-terminated urethane prepolymer is accompanied by dehydrochlorination. The second and third step reactions can be carried out in substantially the same manner as in the second and third step reactions involved in the preparation of urethane prepolymers (iii) described before. Acrylic compounds having one carboxyl group and dicarboxylic anhydrides that may be respectively used in the second and third step reactions involved in the preparation of urethane prepolymers (iii) may also be respectively used in the second and third step reactions involved in the preparation of the urethane prepolymers (iv) desired herein.

The first step reaction of the hydroxyl-terminated urethane prepolymer with the oxirane compound having a halogen atom may be carried out in the presence of a catalyst such as a boron halide, e.g., boron trifluoride, for example, at a temperature of 40° to 100° C. for 90 minutes to 4 hours.

As the preferred oxirane compounds used in the first step reaction, there can be mentioned those represented by the general formula:

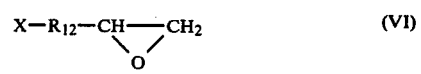
(VI)

wherein X is a halogen atom selected from chlorine, iodine, fluorine and bromine, and $R_{12}$ is a straight or branched chain alkylene group having 1 to 10 carbon atoms or a divalent group of the formula:

$$-CH_2\!-\!\!\left(\!O\!-\!CH_2CH\underset{R_{13}}{|}\right)_{\!\!\overline{p}} \text{ or}$$

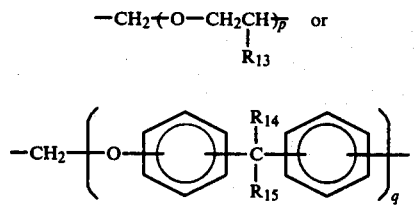

wherein $R_{13}$, $R_{14}$ and $R_{15}$ each independently is a hydrogen atom or a methyl group, and p and q each is an integer of 1 to 5.

They may be used either alone or in mixture.

Preparation of urethane prepolymers (v)

The first step reaction of a hydroxyl-terminated urethane prepolymer with an anhydride of a polycarboxylic acid having at least three carboxyl groups and preferably three or four carboxyl groups is conducted at a ratio defined by the formula: [OH]/[anhydride ring]$\leq 1/1$. By this esterification reaction, substantially two or more carboxyl groups are introduced into each of the terminals of the molecule of the hydroxyl-terminated urethane prepolymer. The reaction may be carried out in substantially the same manner as in the second step reaction involved in the preparation of urethane prepolymers (i) described before. It is not preferred to use an esterification catalyst. The anhydride of the polycarboxylic acid used in the first step reaction must contain only one anhydride ring formed from two carboxyl groups of at least three carboxyl groups present in the molecule by the dehydrocondensation thereof. Trimellitic acid anhydride and hydrogenated trimellitic acid anhydride are preferred as the anhydride of the polycarboxylic acid.

The second step reaction of a carboxyl-terminated urethane prepolymer formed by the first step reaction with an acrylic compound having one oxirane ring is conducted for introducing vinyl groups of acrylic type into the terminals of the molecule of the urethane prepolymer. In order to assure the introduction of substantially one residue of the acrylic compound into each of the terminals of the molecule of the urethane prepolymer, it is desirable that the amount of the acrylic compound to be used be determined with the kind of anhydride of polycarboxylic acid used in the first step reaction being well taken into consideration. The second step reaction may be carried out in substantially the same manner as in the second step reaction involved in the preparation of urethane prepolymers (iii) described before. Preferred examples of the acrylic compound having an oxirane ring include glycidyl acrylate, glycidyl methacrylate, α-ethylglycidyl acrylate and α-ethylglycidyl methacrylate.

The urethane prepolymer (a) used in the photosensitive resinous composition of the present invention, which prepolymer (a) may be selected from urethane prepolymers (i) to (v) thus obtained, has at least 1.6 carboxyl groups, preferably at least 1.8 carboxyl groups, on the average per molecule of the prepolymer. When the urethane prepolymer having less than 1.6 carboxyl groups on the average per molecule thereof is used, the resulting photosensitive resinous composition is poor in developability with aqueous developers, leading to a remaining surface tack of a photopolymer formed therefrom particularly in the relief-unexposed areas and the side wall portions of the relief-exposed areas.

The urethane prepolymer (a) has in the middle of the molecule thereof at least two polyol compound monomer units linked or chain-extended through a diisocyanate compound monomer unit, which is equivalent to saying that the urethane prepolymer (a) has in the middle of the molecule thereof at least two urethane linkages. The term "middle of molecule" as used herein is intended to mean the moiety of the urethane prepolymer (a) molecule originated from an isocyanate- or hydroxyl-terminated urethane prepolymer used for the preparation of the urethane prepolymer (a), which will be apparent from the foregoing.

The weight average molecular weight of the urethane prepolymer (a) is desired to be within the range wherein the resulting photosensitive resinous composition has proper processability as being of liquid type, and is preferably in the range of 500 to 50,000, more preferably in the range of 1,000 to 30,000, when further consideration is given to mechanical strength of a photopolymer formed from the photosensitive resinous composition.

For the measurement of a weight average molecular weight, there is adopted a gel permeation chromatography (GPC) method using, as standard samples, polystyrenes manufactured by Pressure Chemical Co., U.S.A. and as an apparatus, WATERS 200 manufactured by Japan-Waters Co., Japan.

In the preparation of the desired urethane prepolymer selected from the urethane prepolymers (i) to (v), a solvent medium may be used in so far as it does not interfere the reaction or reactions involved. The use of the solvent medium is preferred especially when the reaction mixture with no solvent medium has too high a viscosity. From the viewpoint of easiness of manufacturing, the urethane prepolymers (i) and (ii) are especially preferred.

As the ethylenically unsaturated compound (b) to be used as the crosslinking agent in the urethane photosensitive resinous composition of the present invention, there can be mentioned, for example, vinylpyridine; N-vinylcarbazole; acrylic acid and methacrylic acid, and esters thereof such as acrylates and methacrylates having as the ester-forming group an alkyl, cycloalkyl, tetrahydrofurfuryl, allyl, glycidyl or hydroxyalkyl group; mono- or di-acrylates and mono- or di-methacrylates of an alkylene glycol or a polyoxyalkylene glycol (weight average molecular weight: up to 3,000); mono-, di- or tri-acrylates and mono-, di- or tri-methacrylates of trimethylolpropane; mono-, di-, tri- or tetra-acrylates and mono-, di-, tri- or tetra-methacrylates of pentaerythritol; acrylamide and methacrylamide, and derivatives thereof such as N-hydroxymethylacrylamide, N-hydroxymethylmethacrylamide, N,N'-alkylene-bis-acrylamides, N,N'-alkylene-bis-methacrylamides, diacetone acrylamide and diacetone methacrylamide; aromatic vinyl compounds such as styrene, vinyltoluene and divinylbenzene; allyl compounds such as diallyl phthalate and triallyl cyanurate; vinyl acetate; acrylonitrile; itaconic acid, fumaric acid, maleic acid and maleic anhydride, and mono- or di-esters thereof having as the ester-forming group one or two alkyl groups; unsaturated polyester or alkyd resins (weight average molecular weight: up to 3,000); and unsaturated urethane resins (weight average molecular weight: up to 3,000), for example, those urethane resins modified with an additionpolymerizable monomer with active hydrogen such as a hydroxyalkyl acrylate or a hydroxyalkyl methacrylate. They may be used either alone or in mixture. By the term "alkyl" or "alkylene" as used herein are meant those groups possessing a straight or branched chain having 1 to 20 carbon atoms. By the term "cycloalkyl" as used herein are meant those groups having 3 to 20 carbon atoms and at least one 3- to 8- membered ring unsubstituted or substituted with alkyl, halogen or phenyl. The ethylenically unsaturated compound (b) is preferably used in an amount of 5 to 100 parts by weight per 100 parts by weight of the urethane prepolymer (a). The more preferred amount of the ethylenically unsaturated compound (b) is in the range of from 30 to 70 parts by weight per 100 parts by weight of the urethane prepolymer (a) when the viscosity of the resulting photosensitive resinous composition and physical properties of printing plates prepared from the photosensitive resinuous composition are taken into consideration.

Various known photosensitizers may be used either alone or in mixture as the photopolymerization initiator (c) in the urethane photosensitive resinous composition of the present invention. As such photosensitizers, there can be mentioned, for example, benzoin and derivatives thereof represented by the general formula:

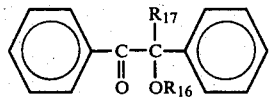

wherein $R_{16}$ is a hydrogen atom or a straight or branched chain alkyl group having 1 to 8 carbon atoms and $R_{17}$ is a hydrogen atom or a group of the formula: $-OR_{18}$ wherein $R_{18}$ is a hydrogen atom or a straight or branched chain alkyl group having 1 to 8 carbon atoms;

benzoyl compounds such as acetophenone, benzophenone and derivatives thereof represented by the general formula:

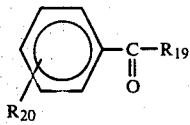

wherein $R_{19}$ is a straight or branched chain alkyl group having 1 to 5 carbon atoms or a group of the formula:

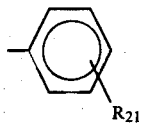

wherein $R_{21}$ is a straight or branched chain alkyl group having 1 to 5 carbon atoms, a halogen atom selected from chlorine, iodine, fluorine and bromine, a nitro group or a group of the formula:

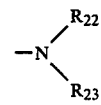

or $-OR_{24}$ wherein $R_{22}$, $R_{23}$ and $R_{24}$ each independently is a hydrogen atom or a straight or branched chain alkyl group having 1 to 5 carbon atoms, and $R_{20}$ is a straight or branched chain alkyl group having 1 to 5 carbon atoms, a halogen atom selected from chlorine, iodine, fluorine and bromine, a nitro group or a group of the formula:

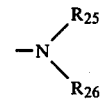

or $-OR_{27}$ wherein $R_{25}$, $R_{26}$ and $R_{27}$ each independently is a hydrogen atom or a straight or branched chain alkyl group having 1 to 5 carbon atoms;

diketones such as benzil, diacetyl, anthraquinone and phenanthraquinone; diphenyl sulfide; eosines; and thionines. The photopolymerization initiator (c) is preferably used in an amount of 0.001 to 10% by weight based on the total weight of the urethane prepolymer (a) and the ethylenically unsaturated compound (b). The more preferred amount of the photopolymerization initiator (c) is in the range of from 0.1 to 5% by weight based on the total weight of the urethane prepolymer (a) and the ethylenically unsaturated compound (b) when the rate or speed of photopolymerization of the resulting photosensitive resinous composition is taken into consideration.

The urethane photosensitive resinous composition of the present invention may further comprise a known heat polymerization inhibitor for stably storing said composition. The heat polymerization inhibitor may be incorporated at the time of mixing the components (a), (b) and (c) or added to the component (a) and/or (b) and/or (c) prior to mixing the components (a), (b) and (c). As the heat polymerization inhibitor that may be used in the photosensitive resinous composition of the present invention, there can be mentioned, for example, hydroquinone, tert-butylhydroquinone, o- or p-benzoquinone, 2,5-diphenyl-p-benzoquinone, picric acid, di-p-fluorophenylamine, p-methoxyphenol and 3,5-di-tert-butyl4-hydroxytoluene (2,6-di-tert-butyl-p-cresol). They may be used either alone or in mixture. It is desirable that the heat polymerization inhibitor prevent the photosensitive resinous composition of the present invention from being subjected in the dark to heat polymerization without sacrificing the photopolymerizability of said composition. In this sense, the amount of the heat polymerization inhibitor, if used, is preferably in the range of 0.005 to 5.0% by weight based on the total weight of the urethane prepolymer (a) and the ethylenically unsaturated compound (b).

An additive or additives other than the components (a), (b) and (c), and a heat polymerization inhibitor may be incorporated preferably in an amount of 0.01 to 100 parts by weight per 100 parts by weight of a mixture consisting of the components (a), (b) and (c) essential in the photosensitive resinous composition of the present invention for properly adjusting the viscosity of the resulting photosensitive resinous composition and the physical properties, water resistance and solvent resistance of a photopolymer formed from the resulting photosensitive resinous composition. Representative examples of such additives include dioctyl phthalate and process oils.

The urethane photosensitive resinous composition of the present invention preferably comprises at least 50% by weight of a mixture of the essential components (a), (b) and (c).

The urethane photosensitive resinous composition of the present invention, which, if liquid, preferably has a viscosity of 50 to 5,000 poises as measured at 20° C., can be polymerized or cured by means of actinic radiation having wave lengths preferably in the range of from 200 nm to 700 nm. As the preferred source of such actinic radiation, there can be mentioned a carbon-arc lamp, a superhigh pressure mercury lamp, a high pressure mercury lamp, a low pressure mercury lamp, a xenon lamp, an ultraviolet fluorescent lamp, a metal halide lamp and sun light.

When the urethane photosensitive resinous composition of the present invention is exposed through a negative or positive image-bearing transparency to actinic radiation, for example, for a period of about 0.5 to 10 minutes, an insoluble photopolymer is formed in the exposed portions of said composition. The photosensitive resinous composition remaining in the unexposed portions can be washed away with an aqueous solution of a surface active agent or an aqueous alkaline solution to effect sufficient development. The washing away or development can also be effected by using an organic solvent such as trichloroethylene, perchloroethylene, 1,1,1-trichloroethane, acetone, methyl ethyl ketone, ethyl acetate or a mixture thereof. After development, the photopolymer is dried and subjected to post exposure to light or actinic radiation, and the resultant may be used as a printing plate.

Printing plates prepared from the urethane photosensitive resinous composition of the present invention are excellent in resistance to printing inks, particularly letterpress inks including UV inks capable of being cured by exposure to ultraviolet rays, in ink transfer evaluated in terms of percentage of the amount of ink transferred onto paper relatively to the amount of ink having been present on a printing plate prior to ink transfer, and in reproducibility of printed image. Also, these printing plates are so excellent in resistances to abrasion and wear and to brittleness under low temperatures that they can withstand printing of, for example, even one million copies in the case of printing business forms by means of a rotary press. Further, they are so excellent in resistance to water or moisture that they change little in physical properties evaluated particularly in terms of printing durability or copy tolerance during the course of storage even under moist circumstances.

The most characteristic feature of the urethane photosensitive resinous composition of the present invention lies in the use of a specific urethane prepolymer, the molecule of which has as the backbone chain a polyurethane chain and in the terminals at least 1.6 carboxyl groups on the average per molecule and acrylic double bonds, each one of said acrylic double bond being substantially present in each terminal of the prepolymer molecule. The use of such a specific urethane prepolymer provides the photosensitive resinous composition of the present invention with good developability with aqueous developers, with substantial freedom from surface tack of the relief-unexposed areas of and complete freedom from surface tack of the relief-exposed areas of the composition when, following development, dried and subjected to post-light-exposure, and with high resistances to water or moisture and to abrasion and wear. Accordingly, the urethane photosensitive resinous composition of the present invention, which is typically of liquid type that is advantageous in respect of easiness of the production of printing plates over those of solid type, can provide printing plates having suitable hardness, excellent mechanical strength characteristics and long durability that have never been attained.

The urethane photosensitive resinous composition of the present invention is typically a liquid having proper viscosity for providing good processability. In general, every variety of thickness of a printing plate is desired depending on kinds of printing machine and material on which printing is made in the field of letterpress printing. In this sense, photosensitive resinous compositions of solid type must be uneconomically supplied, after formed into plates having varied thicknesses, to users, whereas the photosensitive resinous composition of the present invention has only to be supplied as such to users who can easily produce printing plates having any desired thickness in the typical case where the composition is liquid. Further, where printing plates with a large thickness is produced from a liquid photosensitive resinous composition of the present invention, the composition remaining unpolymerized in the unexposed areas is able to be recovered and reused, leading to the reduction of cost of manufacturing printing plates.

The urethane photosensitive resinous composition of the present invention is adapted to be used mainly in the production of printing plates but may of course be used in the field of other polymer-related industry where paints, coatings, adhesives, film materials, plastic molds and so on of photopolymerizable type are manufactured. It is needless to say that a radical polymerization initiator such as azobisisobutyronitrile or benzoyl peroxide can further be incorporated into the photosensitive resinous composition of the present invention for imparting heat polymerizability to said composition.

The following Examples illustrate the present invention in more detail but should not be construed as limiting the scope of the invention.

EXAMPLE 1

A mixture of 615 g (5.22 moles) of 1,6-hexanediol, 233 g (2.25 moles) of neopentylglycol, 867 g (5.94 moles) of adipic acid and 8 g of p-toluenesulfonic acid which was an esterification catalyst was stirred between 120° C. and 180° C. under atmospheric pressure of nitrogen for two hours to effect condensation, and further stirred at 220° C. under reduced pressures between 30 mmHg and 300 mmHg for 5 hours to effect condensation and deglycolation, whereby a polyester diol $A_1$ was formed which had an acid value of 1.2 mgKOH/g and a hydroxyl value of 110 mgKOH/g as determined according to the acetic anhydride-pyridine method which was employed all through Examples and Comparative Examples.

87 g (0.50 moles) of tolylene diisocyanate, which was a mixture of 80% by weight of 2,4-tolylene diisocyanate and 20% by weight of 2,6-tolylene diisocyanate (tolylene diisocyanate used in some of the following Examples and Comparative Examples was also such a mixture), was added at a stroke to 404 g (0.40 moles) of the polyester diol $A_1$ being stirred under an atmosphere of nitrogen and heated in a 50° C. oil bath, and the resulting mixture was stirred under an atmosphere of nitrogen between 50° C. and 85° C. for 4 hours to yield a transparent viscous isocyanate-terminated urethane prepolymer $A_2$ having a weight average molecular weight of about 5,000. The degree of conversion of NCO groups was 99.7% as determined according to the dibutylamine-hydrochloric acid back titration method which was employed all through Examples and Comparative Examples. 0.1 g of 3,5-di-tert-butyl-4-hydroxytoluene (hereinafter abbreviated as BHT) was added to the reaction system, the atmosphere of which had been changed from nitrogen to air, and the resulting mixture was stirred at 80° C. for 10 minutes. 46 g (0.22 mole) of GMGA (trade name of an acrylic ester mixture manufactured by Kyoeisha Yushi Kagaku Kogyo Co. Ltd., Japan), which is a mixture composed of 7 parts by mole of glyceryl monomethacrylate and 3 parts by mole of an adduct of glycolic acid with glycidyl methacrylate and having an acid value of 5.3 mgKOH/g and a hydroxyl value of 550 mgKOH/g, and 0.05 g of dibutyltin laurate (hereinafter abbreviated as BTL) were added to the reaction system, and the resulting mixture was stirred at 80° C. for 2 hours to effect the introduction of vinyl groups of acrylic type into the prepolymer $A_2$. The degree of advance of the reaction was traced by observing the change of absorption peak at 2270 $cm^{-1}$ characteristic of NCO groups and appearing in an infrared spectrum chart (hereinafter abbreviated as IR chart). With respect to the reaction mixture obtained 1.5 hours after the start of the reaction, a very small peak was observed at 2270 $cm^{-1}$. With respect to the reaction mixture obtained 2 hours after the start of the reaction, only a trace of peak was observed at 2270 $cm^{-1}$, proving that the residues of GMGA were substantially introduced into both the terminals of the molecule of the prepolymer $A_2$ by the urethane-forming reaction to yield a hydroxyl- and methacrylate-terminated urethane prepolymer.

Subsequently, the temperature of the oil bath was elevated to 90° C., at which 22 g (0.22 mole) of succinic anhydride pulverized by means of a mortar was added to the reaction system and the resulting mixture was stirred for 3 hours. The degree of advance of the half ester-forming reaction with succinic anhydride was traced in terms of acid value of the reaction mixture which was determined every one hour. 3 Hours after the start of the reaction, the acid value of the reaction mixture reached a level where it would have remained substantially constant thereafter. The desired urethane prepolymer J was thus obtained which was colorless, transparent and highly viscous and which had a weight average molecular weight of about 5,900.

100 g of the urethane prepolymer J was well mixed with a solution composed of 30 g of diethylene glycol dimethacrylate, 30 g of 2-hydroxypropyl methacrylate, 3.2 g of benzoin isobutyl ether and 0.1 g of BHT to prepare a photosensitive resinous composition.

The photosensitive resinous composition was coated at a thickness of about 0.7 mm on an about 10 µ-thick adhesive coating provided on a 0.1 mm-thick polyester film placed on a 12 mm-thick glass plate and consisting of a polyurethane adhesive which was a 100:5 by weight mixture of AD 503 A and ADF-J (trade names of products manufactured by Toyo Ink Mfg. Co. Ltd., Japan). The layer of the photosensitive resinous composition was covered with a 12 µ-thick polypropylene film, on which a negative film was then placed in close contact under the weight of a 12 mm-thick glass plate subsequently placed on the negative film. The layer of the photosensitive resinous composition was first exposed for 30 seconds from the side of the polyester film to light emitted from a chemical lamp FL 20 BL (trade name of a product manufactured by Tokyo Shibaura Electric Company Ltd., Japan) located at a distance of 10 cm from the outer surface of the glass plate, and then exposed for 60 seconds from the side of the negative film to light emitted from a 2 KW mercury lamp located at a distance of 50 cm from the outer surface of the glass plate. After the light exposure, the glass plates, the negative film and the polypropylene film were removed, and a 0.3 weight % sodium carbonate aqueous solution having a temperature of 40° C. was sprayed under a pressure of 2.5 kg/cm² for 2 minutes onto the layer of the resinous composition located at a distance of 10 cm from a spray nozzle to sufficiently wash away the uncured resinous composition in the relief-unexposed areas. After washing with water and drying, the layer of the resinous composition was further exposed for 60 seconds from the outer surface thereof to light emitted from the 2 KW mercury lamp located at a distance of 20 cm from the outer surface of the composition layer to prepare a sharp relief-imaged plate comprising a tough photopolymer free from surface tack which plate was suitable for use in letterpress printing. The height of the relief was 0.6 mm, and the Shore hardness of the relief imaged-portions was 75 as measured at 20° C. by means of a Shore 'D' durometer (the symbol 'D' will hereinafter be prefixed to the numerals representing the data obtained by means of the Shore 'D' durometer). After the relief-imaged plate was allowed to stand in a desiccator maintained at 5° C. for a day, the Shore hardness of the relief-imaged portions was again measured and found to be D78 at 5° C., and the photopolymer was substantially as good in flexibility at 5° C. as at 20° C. or, in other words, did not show brittleness at all at low temperatures.

Printing was carried out by using the relief-imaged plate mounted as the letterpress printing plate on a letterpress proof press to produce a print with a good image having a sharp marginal zone and savoring of a printed image produced by using a metal printing type.

The above-mentioned photosensitive resinous composition was cast in a spacing surrounded by spacers of 1.0 mm in height disposed on a 9 µ-thick polyester film placed on a 5 mm-thick glass plate, and covered with a 9 µ-thick polyester film without bubbles being formed therebetween, followed by placing thereon a 5 mm-thick glass plate. The layer of the photosensitive resinous composition was exposed for 10 minutes each from both sides to light emitted from the chemical lamps FL 20 BL respectively located on both sides at a distance of 10 cm from the respective glass plates. After the light exposure, the glass plates and both sheets of the polyester film were removed, and an about 1 mm-thick sheet of a photopolymer formed from the photosensitive resinous composition was die-cut by means of a JIS No. 1 dumbell die (JIS: Japanese Industrial Standard). A dumbell specimen was subjected to tensile testing by using a tensile machine S-100-D (trade name of a product manufactured by Shimadzu Seisakusho Ltd., Japan) to measure a tensile breaking strength and tensile breaking elongation, which are shown in Table 2 that will be given later. The Shore hardness of the photopolymer was also measured by means of the Shore 'D' durometer, and was found to be as shown in Table 2. The viscosity of the photosensitive resinous composition was examined by using a Brookfield rotational viscometer Model B8H (trade name of product manufactured by Tokyo Keiki Seizo-Sho Ltd., Japan), and found to be as shown in Table 2.

COMPARATIVE EXAMPLE 1

A photosensitive resinous composition and a printing plate therefrom were prepared in substantially the same manner as in Example 1 except that the same hydroxyl- and methacrylate-terminated urethane prepolymer as prepared in Example 1 but not subjected to half esterification was used instead of the urethane prepolymer J. The printing plate was of no practical use at all because the washout of the unexposed portions of the composition was quite incomplete owing to very poor solubility of the uncured photosensitive resinous composition in a 0.3 weight % sodium carbonate aqueous solution as the developer.

COMPARATIVE EXAMPLE 2

A mixture of 89 g (0.75 mole) of 1,6-hexanediol, 26 g (0.25 mole) of neopentyl glycol, 146 g (1 mole) of adipic acid and 0.13 g of p-toluenesulfonic acid was subjected to condensation which was effected in substantially the same manner as in Example 1 to yield an ester diol having an acid value of 10.8 mgKOH/g, and, following the addition of 31 g (0.5 mole) of ethylene glycol to the reaction system, further subjected to condensation and deglycolation which were effected in substantially the same manner as in Example 1 to yield a polyester diol $A_3$ having an acid value of 1.8 mgKOH/g, a hydroxyl value of 23 mgKOH/g and a weight average molecular weight of about 4,500.

A mixture of 34 g (0.2 mole) of tolylene diisocyanate and 0.1 g of BTL was added at a stroke to 450 g (0.1 mole) of the polyester polyol $A_3$, and the reaction was carried out in substantially the same manner as in Example 1 to prepare an isocyanate-terminated polyester prepolymer $A_4$. The degree of conversion of NCO groups was 99.5%. By using 22 g (0.11 mole) of GMGA and 11 g (0.11 mole) of succinic anhydride, a transparent viscous urethane prepolymer K having an acid value of 25.5 mgKOH/g was prepared from the isocyanate-terminated polyester prepolymer $A_4$ in substantially the same manner as in Example 1.

A photosensitive resinous composition and a sheet of a photopolymer therefrom were prepared in substantially the same manner as in Example 1 except that the urethane prepolymer K was used instead of the urethane prepolymer J. The viscosity of the photosensitive resinous composition, and the Shore hardness and tensile breaking strength and elongation of the photopolymer were examined in the same manner as in Example 1, and found to be as shown in Table 2. It was noted that the photopolymer of this Comparative Example was very poor in Shore hardness and tensile breaking strength.

COMPARATIVE EXAMPLE 3

A photosensitive resinous composition and a printing plate therefrom were prepared in substantially the same manner as in Example 1 except that an unsaturated polyester type prepolymer obtained by condensation of propylene glycol, diethylene glycol, adipic acid, fumaric acid and isophthalic acid (0.30/0.20/0.15/0.25/0.10 by mole) and having an acid value of 17 mgKOH/g and a weight average molecular weight of about 3,300 was used instead of the urethane prepolymer J.

EXAMPLE 2

Substantially the same procedures as in Example 1 were repeated to prepare two kinds of desired urethane prepolymers J' and J" having varied weight average molecular weights, except that the molar ratio of a polyester diol $A_1$ to tolylene diisocyanate was varied and that GMGA and succinic anhydride were used in amounts of 1.05 times and 1.025 times, respectively, the stoichiometric amounts thereof. The weight average molecular weights of isocyanate-terminated urethane prepolymers used as the intermediates for the preparation of urethane prepolymers J' and J" were about 3,000 and about 1,500, respectively.

Photosensitive resinous compositions and printing plates therefrom were prepared from the respective urethane prepolymers J' and J" instead of the urethane prepolymer J in substantially the same manner as in Example 1. Both of the photosensitive resinous compositions were so excellent in developability that the printing plates had no uncured resinous compositions remaining anywhere in the reversed-image, shadow and complicated-image portions, with the result that sharp printed images were reproduced in printing by means either of the printing plates.

Comparison in Resistance to Abrasion

The abrasion resistance of each of the printing plates prepared in Examples 1 and 2, and Comparative Examples 2 and 3 was examined by using a Taber rotary abrader manufactured by Toyo Seiki Seisaku-Sho Ltd., Japan (abrading wheel: CS-17, load: 1 kg, abrasion cycle: 5,000 times). The results were as shown in Table 1 below.

It was noted in Table 1 that the printing plates formed from the photosensitive resinous compositions of urethane type were much better in resistance to abrasion than that of polyester type.

TABLE 1

| Example No. | Prepolymer | Acid Number of Prepolymer (mgKOH/g) | Weight Average Molecular Weight of Prepolymer | Abrasion Loss (mg) | Abrasion Index** |
|---|---|---|---|---|---|
| Example 1 | J (urethane) | 24 | (5000)* | 15 | 1.0 |
| Example 2 | J' (urethane) | 31.5 | (3000)* | 35 | 2.3 |
| Example 2 | J" (urethane) | 53.9 | (1500)* | 85 | 5.7 |
| Comparative Example 1 | K (urethane) | 1.2 | (4500)* | 25 | 1.7 |
| Comparative | (polyester) | 25.5 | 3300 | 120 | 8.0 |

TABLE 1-continued

| Example No. | Prepolymer | Acid Number of Prepolymer (mgKOH/g) | Weight Average Molecular Weight of Prepolymer | Abrasion Loss (mg) | Abrasion Index** |
| --- | --- | --- | --- | --- | --- |
| Example 2 | | | | | |

Note
*The numerals in the parentheses represent the weight average molecular weights of the isocyanate-terminated prepolymers used as the intermediates for the production of the desired urethane prepolymers.
**The abrasion indices are the relative values obtained on the assumption that the abrasion index of the printing plate obtained in Example 1 is 1.

EXAMPLE 3

A mixture of 404 g (0.4 mole) of a polyester diol $A_1$ as prepared in Example 1 and 87 g (0.50 mole) of tolylene diisocyanate was subjected to substantially the same urethane-forming reaction as in Example 1 to prepare an isocyanate-terminated urethane prepolymer $A_2'$. The degree of conversion of NCO groups was 99.5%.

0.1 g of BHT was added to the reaction system, the atmosphere of which had been changed from nitrogen to air, and the resulting mixture was stirred at 85° C. for 10 minutes. 46 g (0.22 mole) of GMGA, 22 g (0.22 mole) of succinic anhydride, and 0.05 g of BTL were simultaneously added to the reaction system, the resulting mixture was stirred at 85° C. for 3.5 hours to prepare the desired transparent, highly visious urethane prepolymer L having an acid value of 25 mgKOH/g and similar to the prepolymer J prepared in Example 1. The presence of NCO groups in the prepolymer L could not be detected in an IR chart.

A photosensitive resinous composition and a printing plate therefrom was prepared in substantially the same manner as in Example 1 except that the urethane prepolymer L was used instead of the urethane prepolymer J. The printing plate had a sharp relief image made of a photopolymer free from surface tack like the printing plate produced in Example 1. An about 1 mm-thick sheet of a photopolymer was formed from the photosensitive resinous composition in substantially the same manner as in Example 1. The viscosity of the photosensitive resinous composition, and the Shore hardness and tensile breaking strength and elongation of the photopolymer were examined in the same manner as in Example 1, and found to be as shown in Table 2 and substantially the same as those in Example 1.

Comparison in Viscosity and Physical Properties

TABLE 2

| | Example 1 | Example 3 | Comparative Example 2 |
| --- | --- | --- | --- |
| Viscosity of Composition (20° C.) | 370 poises | 350 poises | 220 poises |
| Photopolymer | | | |
| Tensile Breaking Strength (20° C.) | 405 kg/cm$^2$ | 410 kg/cm$^2$ | 195 kg/cm$^2$ |
| Tensile Breaking Elongation (20° C.) | 100% | 98% | 95% |
| Shore (20° C.) | D70 | D71 | D34 |
| Hardness (5° C.) | D74 | D74 | D50 |

EXAMPLE 4

A mixture of 204 g (1.0 mole) of GMGA as used in Example 1, 100 g (1.0 mole) of succinic anhydride and 0.2 g of BHT was stirred in an atmosphere of air at 90° C. for 4 hours to yield a half-esterified acrylic ester mixture F having an acid value of 185 mgKOH/g (theoretical acid value: 187.5 mgKOH/g).

A mixture of 404 g (0.40 mole) of a polyester diol $A_1$ and 87 g (0.50 mole) of tolylene diisocyanate was subjected to substantially the same urethane-forming reaction as in Example 1 to prepare an isocyanate-terminated urethane prepolymer $A_{1''}$. The degree of conversion of NCO groups was 99.8%. 61 g (0.20 mole) of the half-esterified acrylic ester mixture F and 0.07 g of BTL were added to the isocyanate-terminated urethane prepolymer $A_{1''}$ thus prepared, and the resulting mixture was stirred in an atmosphere of air at 85° C. for 3 hours to yield the desired transparent, highly viscous urethane prepolymer M having an acid value of 2.1 mgKOH/g and similar to the prepolymer J prepared in Example 1. No absorption peak at 2270 cm$^{-1}$ characteristic of NCO groups appeared in an IR chart.

A photosensitive resinous composition was prepared in substantially the same manner as in Example 1 except that the urethane prepolymer M was used instead of the urethane prepolymer J. The viscosity, at 20° C., of the photosensitive resinous composition was 450 poises which was a little high as compared with that of the composition prepared in Example 1. A printing plate was prepared in substantially the same manner as in Example 1 except that the photosensitive resinous composition prepared in this Example and a 1 weight % sodium borate aqueous solution as the developer were used instead of those used in Example 1. The printing plate was hard but elastic.

Printing was carried out by using the printing plate mounted on a letterpress proof press to produce a print having a sharp image savoring of a printed image produced by using a metal printing type.

EXAMPLE 5

A mixture of 440 g (0.44 mole) of Polylite (trade mark) ODX-240 (trade name of a polyester diol manufactured by Dainippon Ink And Chemicals Inc., Japan) and 59 g (0.34 mole) of tolylene diisocyanate was well stirred in an atmosphere of nitrogen at 85° C. for 3 hours to prepare a hydroxylterminated urethane prepolymer $A_5$ having a weight average molecular weight of about 5,000.

324 g (3.52 moles) of epichlorohydrin and then 5 g of an ether solution containing a boron trifluoride-ether adduct at a boron trifluoride concentration of 5% by weight was added to the hydroxyl-terminated urethane prepolymer $A_5$ being stirred in an atmosphere of nitrogen and contained in a reactor equipped with a condenser, and the resulting mixture was stirred between 50° C. and 85° C. for 4 hours with the reactor being cooled intermittently with ice, followed by the removal of excess epichlorohydrin by distillation between 110° C. and 150° C. under a reduced pressure of 50 mmHg for 5 hours. 125 g of a 30 weight % sodium hydroxide aqueous solution was added to the reaction product thus obtained, and the resulting mixture was stirred in an atmosphere of nitrogen between 70° C. and 90° C. for 7 hours to effect neutralization of HCl formed. A prepolymer thus formed was washed four times each with 150 g of 50° C. pure water, the mixture of the prepolymer and pure water being vigorously agitated at 50° to 60° C. The hydrolyzable chlorine content of the washed prepolymer was about 0.05% by weight. The washed prepolymer was dried in an atmosphere of nitrogen at 60° to 80° C. under a reduced pressure of 300 mmHg for a day to obtain a substantially pure epoxy-terminated urethane prepolymer $A_6$ having an epoxy equivalent of 2,450 as determined according to the iodine addition method.

125 g (0.52 mole) of diethylene glycol dimethacrylate, 15 g (0.21 mole) of methacrylic acid, 0.6 g of hydroquinone and 8 g of trimethylammonium hydroxide as a tertiary amine catalyst were added to 490 g (0.10 mole) of the epoxy-terminated urethane prepolymer $A_6$, and the resulting mixture was stirred in an atmosphere of air between 110° C. and 120° C. for 5 hours to yield a blownish viscous vinyl-terminated urethane prepolymer $A_7$ having an acid value of 2.8 mgKOH/g.

27 g (0.18 mole) of tetrahydrophthalic anhydride was added to the vinyl-terminated urethane prepolymer $A_7$ thus prepared, and the resulting mixture was stirred in an atmosphere of air at 90° C. for 2 hours to effect half esterification. Thus, the desired blownish viscous urethane prepolymer O was prepared which had an acid value of 33 mgKOH/g.

130 g of 2-hydroxypropyl methacrylate, 8 g of benzoin isobutyl ether and 0.2 g of p-methoxyphenol was added to and well mixed with the urethane prepolymer O thus prepared to form a photosensitive resinous composition. A printing plate was prepared in substantially the same manner as in Example 1 except that the photosensitive resinous composition prepared in this Example was used instead of that prepared in Example 1. The printing plate which was suitable for use in letterpress printing was tough and excellent in resolution of an image formed thereon.

COMPARATIVE EXAMPLE 4

A photosensitive resinous composition was prepared in substantially the same manner as in Example 1 except that succinic anhydride was not used in the preparation of the desired urethane prepolymer. A printing plate was prepared from the photosensitive resinous composition thus prepared in substantially the same manner as in Example 1. However, the washout of the uncured resinous composition was so insufficient in the development that the printing plate was too poor in resolution to be practically useful.

EXAMPLE 6

A mixture of 173 g (0.34 mole) of Polylite (trade mark) ODX-2171 (trade name of a polycaprolactone having an acid value of 0.20 mgKOH/g and a hydroxyl value of 220 mgKOH/g, manufactured by Dainippon Ink And Chemicals Inc., Japan) and 77 g (0.44 mole) of tolylene diisocyanate was stirred in an atmosphere of nitrogen at 85° C. for 4 hours to yield a polyester-urethane diol $A_8$ having a weight average molecular weight of about 2,500.

15 g (0.203 mole) of Epiol (trade mark) OH (trade name of glycidol having an oxirane oxygen content of 20.5% by weight, manufactured by Nippon Oil and Fats Co. Ltd., Japan), 0.05 g of BTL and 0.1 g of BHT were added to the reaction system, and the resulting mixture was stirred at 85° C. for 2 hours. It was confirmed that the absorption peak at 2270 cm$^{-1}$ characteristic of NCO groups disappeared in an IR chart.

18 g (0.21 mole) of methacrylic acid and 1.0 g of benzyldimethylamine were added to the reaction system, the atmosphere of which had been changed from nitrogen to air, and the resulting mixture was stirred at 95° C. for 12 hours to yield a vinyl-terminated urethane prepolymer $A_9$ having an acid value of 5.8 mgKOH/g.

21 g (0.21 mole) of succinic anhydride was added to the reaction system, and the resulting mixture was stirred at 95° C. for 1.5 hours. Thus, the desired urethane prepolymer P was prepared which had an acid value of 37 mgKOH/g.

100 g of the urethane prepolymer P was mixed with 20 g of tetraethylene glycol dimethacrylate, 20 g of 2-hydroxypropyl methacrylate, 10 g of diacetone acrylamide, 10 g of trimethylolpropane trimethacrylate, 3 g of benzoin isopropyl ether and 0.1 g of p-methoxyphenol to prepare a photosensitive resinous composition.

A letterpress printing plate was prepared from the photosensitive resinous composition thus prepared in substantially the same manner as in Example 1. The printing plate was flexible, had a clear image, and was free from surface tack in both the relief image areas and the nonimage areas.

EXAMPLE 7

A mixture of 257.3 g (0.1 mole) of Takelac (trade mark) U-2320 (trade name of a polypropylene adipate having an acid value of 2.0 mgKOH/g and a hydroxyl value of 43.6 mgKOH/g, manufactured by Takeda Chemical Industry Ltd., Japan), 200 g (0.1 mole) of SANNIX (trade mark) PP-2000 (trade name of polypropylene glycol manufactured by Sanyo Chemical Industries Ltd., Japan), 52.3 g (0.3 mole) of tolylene diisocyanate and 0.01% by weight, based on the mixture, of BTL was stirred in an atmosphere of nitrogen at 85° C. for 2 hours to yield a transparent viscous isocyanate-terminated urethane prepolymer $A_{10}$. The degree of conversion of NCO groups was 98.3%.

32 g (0.2 mole) of glyceryl monomethacrylate and 0.1% by weight, based on the resulting mixture, of BHT was added to the reaction system, the atmosphere of which had been changed from nitrogen to air, and the vinyl group-introducing reaction was continued at 85° C. for 2 hours. The absorption peak at 2270 cm$^{-1}$ characteristic of NCO groups was not recognized in an IR chart.

20 g (0.2 mole) of succinic anhydride was added to the reaction system, and the half-esterification reaction was continued until the acid value of the resulting prepolymer reached 21 mgKOH/g. Thus, a vinyl- and carboxyl-terminated urethane prepolymer Q was obtained.

100 g of the urethane prepolymer Q was mixed with 20 g of 2-hydroxypropyl methacrylate, 10 g of NK Ester (trade mark) P-9G (trade name of a polypropylene glycol dimethacrylate manufactured by Shin-Nakamura Chemical Co. Ltd., Japan), 30 g of polypropylene glycol monomethacrylate (weight average molecular weight: 1,000), 2 g of benzoin isobutyl ether and 0.1 g of p-methoxyphenol to prepare a photosensitive resinous composition.

A printing plate was prepared from the photosensitive resinous composition thus obtained in substantially the same way as in Example 1 except that the development was carried out with a developer which was an aqueous solution of 1 weight % of sodium borate and 1 weight % of a mixed dispersant [an aqueous solution of 15 weight % of Liporan (trade mark) AO (trade name of a surface active agent manufactured by Lion Corporation, Japan) and 15 weight % of Lipponox (trade mark) NCH (trade name of a surface active agent manufactured by Lion Corporation, Japan)] and which was sprayed under a pressure of 1 kg/cm² and that the post exposure was carried out by means of the chemical lamp FL 20 BL located at a distance of 10 cm from the outer surface of the composition layer instead of the 2 KW mercury lamp located at a distance of 20 cm from the outer surface of the composition layer for 10 minutes instead of 60 seconds. In the development, the washout of the uncured resinous composition in the reversed-image portions and fine lines-including portions of the printing plate was quite satisfactory as compared with that of the conventional polyester-ether-urethane photosensitive resinous compositions. The printing elements of the printing plate had sharp shoulders. The printing plate was completely free from surface tack in both the relief image areas and the non-image areas unlike those prepared from the conventional polyester-ether-urethane photosensitive resinous composition.

50 liters of the developer (washout agent) could be used for the preparation of 40 or more printing plates of A-3 size from the photosensitive resinous composition prepared in this Example as against 20–25 printing plates of the same size from the conventional polyester-ether-urethane photosensitive resinous compositions.

EXAMPLE 8

A mixture of 175 g (0.3 mole) of Takelac (trade mark) U-2305 (trade name of a polypropylene adipate having an acid value of 2.0 mgKOH/g and a hydroxyl value of 193.1 mgKOH/g, 200 g (0.2 mole) of SANNIX (trade mark) PP-1000 (trade name of a polypropylene glycol manufactured by Sanyo Chemical Industries Ltd., Japan), 79.4 g (0.4 mole) of tolylene diisocyanate and 0.01% by weight, based on the mixture, of BTL was stirred in an atmosphere of nitrogen at 85° C. for 2 hours to yield a hydroxyl-terminated urethane prepolymer $A_{11}$. The absorption peak at 2270 cm$^{-1}$ characteristic of NCO groups was not recognized in an IR chart.

38.2 g (0.2 mole) of trimellitic anhydride was added to the reaction system, the resulting mixture was stirred at 85° C. for 3 hours to effect half-esterification. Thus, a hydroxyl-terminated urethane prepolymer was prepared which had an acid value of 46.3 mgKOH/g.

All the hydroxyl-terminated urethane prepolymer thus prepared was mixed with 28.4 g (0.2 mole) of glycidyl methacrylate, 0.01 weight %, based on the resulting mixture, of BHT and 0.1 weight %, based on the resulting mixture, of tribenzylammonium chloride. The resulting mixture was stirred at 85° C. for 5 hours to effect the vinyl group-introducing reaction. Thus, the desired urethane prepolymer R was preprepared which had an acid value of 24.4 mgKOH/g.

100 g of the urethane prepolymer R was mixed with 30 g of 2-hydroxyethyl methacrylate, 20 g of NK Ester P-9G (polypropylene glycol dimethacrylate), 3 g of benzoin ethyl ether and 0.1 g of p-methoxyphenol to prepare a photosensitive resinous composition.

A printing plate was prepared from the photosensitive resinous composition thus prepared in substantially the same manner as in Example 1. The resinous composition was excellent in developability like that prepared in Example 7, and the printing plate was substantially free from surface tack.

COMPARISON IN PHYSICAL PROPERTIES

An about 1 mm-thick sheet of a photopolymer was formed from each of the photosensitive resinous compositions prepared in Examples 7 and 8 in substantially the same manner as in Example 1. The Shore hardness and tensile breaking strength and elongation of the photopolymer were examined all at 20° C. in substantially the same manner as in Example 1 except that a JIS No. 4 dumbell die was used instead of the JIS No. 1 dumbell die and that a Shore 'A' durometer was used instead of the Shore 'D' durometer, and found to be as shown in Table 4.

TABLE 4

| | Shore Hardness | Tensile Breaking Strength | Tensile Breaking Elongation |
| --- | --- | --- | --- |
| Example 7 | A72 | 153 kg/cm² | 174% |
| Example 8 | A85 | 208 kg/cm² | 152% |

What is claimed is:

1. A urethane photosensitive resinous composition comprising (a) at least one urethane prepolymer having in the middle of the molecule thereof at least two polyol compound monomer residues linked through urethane bonds and having only in the terminals of the molecule thereof at least 1.6 carboxyl groups on the average per molecule and acrylic residues represented by the formula:

wherein R is a hydrogen atom or a methyl group, each one of said acrylic residues being substantially present in each terminal of the molecule of said at least one urethane prepolymer, (b) at least one ethylenically unsaturated compound, and (c) at least one photopolymerization initiator.

2. A urethane photosensitive resinous composition as claimed in claim 1, which further comprises at least one heat polymerization inhibitor.

3. A urethane photosensitive resinous composition as claimed in claim 1, which comprises 100 parts by weight of the component (a), 5 to 100 parts by weight of the component (b), and 0.001 to 10% by weight, based on the total weight of the components (a) and (b), of the component (c).

4. A urethane photosensitive resinous composition as claimed in claim 3, which further comprises 0.005 to 5.0% by weight, based on the total weight of the components (a) and (b), of at least one heat polymerization inhibitor.

5. A urethane photosensitive resinous composition as claimed in any one of claims 1 to 4, wherein said component (a) is at least one member selected from the group consisting of (i) a urethane prepolymer which is obtained by reacting an isocyanate-terminated urethane prepolymer with at least one acrylic compound having two hydroxyl groups at a molar ratio of NCO/OH of up to ½ and reacting the resultant with at least one dicarboxylic anhydride, (ii) a urethane prepolymer which is obtained by reacting an isocyanate-terminated urethane prepolymer with at least one acrylic compound having one hydroxyl group and one carboxyl group at a molar ratio of NCO/OH of up to 1/1, (iii) a urethane prepolymer which is obtained by reacting an isocyanate-terminated urethane prepolymer with at least one oxirane compound having one hydroxyl group at a molar ratio of NCO/OH of up to 1/1, reacting the resultant with at least one acrylic compound having one carboxyl group at a molar ratio of oxirane ring/COOH of up to 1/1 and further reacting the resultant with at least one dicarboxylic anhydride, (iv) a urethane prepolymer which is obtained by reacting a hydroxyl-terminated urethane prepolymer with at least one oxirane compound having one halogen atom at a molar ratio of OH/halogen atom of up to 1/1, reacting the resultant with acrylic acid and/or methacrylic acid and further reacting the resultant with at least one dicarboxylic anhydride, and (v) a urethane prepolymer which is obtained by reacting a hydroxyl-terminated urethane prepolymer with at least one anhydride of a polycarboxylic acid having at least three carboxyl groups including only two carboxyl groups forming an anhydride ring at a molar ratio of OH/anhydride ring of up to 1/1 and reacting the resultant with at least one acrylic compound having one oxirane ring.

6. A urethane photosensitive resinous composition as claimed in claim 5, wherein said isocyanate-terminated urethane prepolymer is a product obtained by a reaction between at least one polyol compound and an excess amount of at least one diisocyanate compound.

7. A urethane photosensitive resinous composition as claimed in claim 5, wherein said hydroxyl-terminated urethane prepolymer is a product obtained by a reaction between at least one diisocyanate compound and an excess amount of at least one polyol compound.

8. A urethane photosensitive resinous composition as claimed in claim 6 or 7, wherein said at least one polyol compound is selected from alkanediols, polyether diols and polyester diols.

9. A urethane photosensitive resinous composition as claimed in claim 8, wherein said polyester polyols are polylactones.

10. A urethane photosensitive resinous composition as claimed in claim 5, wherein said at least one acrylic compound having two hydroxyl groups is a compound represented by the formula:

$$CH_2=C(R_1)-C(=O)-O-R_2-OH \quad (II)$$

wherein $R_1$ is a hydrogen atom or a methyl group, and $R_2$ is

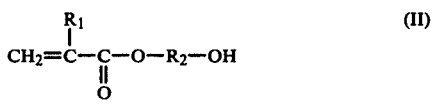

11. A urethane photosensitive resinous composition as claimed in claim 5, wherein said at least one dicarboxylic anhydride is a compound represented by the formula

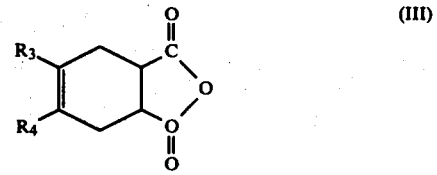 (III)

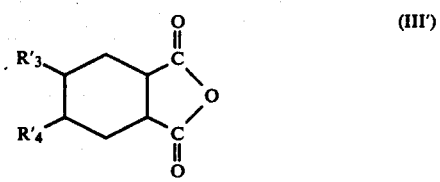 (III')

or

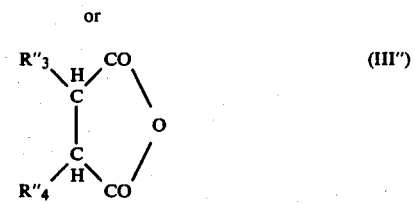 (III")

where $R_3$, $R_4$, $R_3'$, $R_4'$, $R_3''$ and $R_4''$ each independently is a hydrogen atom or a lower alkyl group having 1 to 3 carbon atoms.

12. A urethane photosensitive resinous composition as claimed in claim 5, wherein said at least one acrylic compound having one hydroxyl group and one carboxyl group is a compound represented by the formula:

$$CH_2=C(R_5)-C(=O)-O-R_6-COOH \quad (IV)$$

wherein $R_5$ is a hydrogen atom or a methyl group, and $R_6$ is a divalent group of the formula:

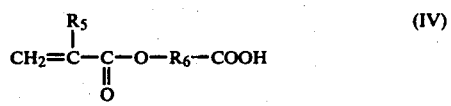

wherein $R_7$ and $R_7'$ each is a divalent group of the formula:

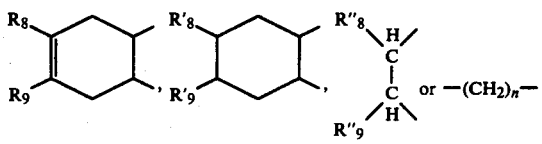

wherein $R_8$, $R_9$, $R_8'$, $R_9'$, $R_8''$ and $R_9''$ each independently is a hydrogen atom or a lower alkyl group having 1 to 3 carbon atoms, and n is an integer of 3 to 5.

13. A urethane photosensitive resinous composition as claimed in claim 6 or 7, wherein said at least one diisocyanate compound is selected from 2,4-tolylene diisocyanate, 2,6-tolylene diisocyanate, hydrogenated 2,4-tolylene diisocyanate, hydrogenated 2,6-tolylene diisocyanate, 4,4'-diphenylmethane diisocyanate and 1,6-hexamethylene diisocyanate.

14. A urethane photosensitive resinous composition as claimed in claim 5, wherein said at least one oxirane compound having one hydroxyl group is a compound represented by the formula:

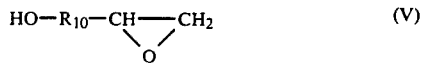 (V)

wherein $R_{10}$ is a straight or branched chain alkylene group having 1 to 10 carbon atoms or a divalent group of the formula:

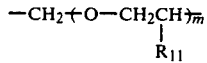

wherein $R_{11}$ is a hydrogen atom or a methyl group, and m is an integer of 1 to 3.

15. A urethane photosensitive resinous composition as claimed in claim 5, wherein said at least one oxirane compound having one halogen atom is a compound represented by the formula:

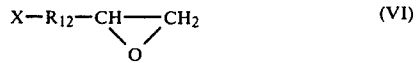 (VI)

wherein X is a halogen atom selected from chlorine, iodine, fluorine and bromine, and $R_{12}$ is a straight or branched chain alkylene group having 1 to 10 carbon atoms or a divalent group of the formula:

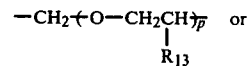 or

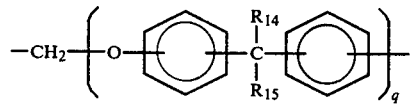

wherein $R_{13}$, $R_{14}$ and $R_{15}$ each independently is a hydrogen atom or a methyl group, and p and q each is an integer of 1 to 5.

16. A urethane photosensitive resinous composition as claimed in claim 5, wherein said at least one anhydride of a polycarboxylic acid is trimellitic acid anhydride.

17. A urethane photosensitive resinous composition as claimed in claim 5, wherein said at least one acrylic compound having one oxirane ring is selected from glycidyl acrylate and glycidyl methacrylate.

18. A urethane photosensitive resinous composition as claimed in any one of claims 1 to 17, wherein said component (a) has a weight average molecular weight of 500 to 50,000.

* * * * *